United States Patent [19]

Kidd

[11] 3,868,677

[45] Feb. 25, 1975

[54] PHASE-LOCKED VOLTAGE-TO-DIGITAL CONVERTER

[75] Inventor: Marshall C. Kidd, Wayland, Mass.

[73] Assignee: General Electric Company, Lynn, Mass.

[22] Filed: June 11, 1973

[21] Appl. No.: 368,592

Related U.S. Application Data

[63] Continuation-in-part of Ser. No. 264,733, June 21, 1972.

[52] U.S. Cl. .................... 340/347 AD, 340/347 CC

[51] Int. Cl. .......................................... H03k 13/20

[58] Field of Search ............. 340/347 AD, 347 NT, 340/347 CC; 324/99 D, 130; 328/133, 134

[56] References Cited

UNITED STATES PATENTS

| | | | |
|---|---|---|---|
| 3,192,371 | 6/1965 | Brahm | 340/347 AD |
| 3,325,727 | 6/1967 | Haas | 340/347 AD |
| 3,327,229 | 6/1967 | Huelsman | 340/347 AD |
| 3,440,645 | 4/1969 | Feigleson | 340/347 AD |
| 3,488,588 | 1/1970 | Deavenport et al. | 324/99 D |
| 3,500,196 | 3/1970 | Cooper | 340/347 CC |
| 3,568,181 | 3/1971 | Weaver | 340/347 AD |
| 3,662,163 | 5/1972 | Miller et al. | 340/347 AD |
| 3,668,690 | 6/1972 | Ormond | 340/347 CC |
| 3,706,092 | 12/1972 | Cox, Jr. et al. | 340/347 AD |
| 3,737,891 | 6/1973 | Metcalf | 340/347 CC |

*Primary Examiner*—Charles D. Miller

[57] ABSTRACT

An analog voltage-to-digital converter employing a phase-locked loop. An input voltage to be converted is applied to a voltage controlled oscillator through an input impedance. The output of the first voltage controlled oscillator is divided in a first counter to provide a square wave input to one input of a phase detector. A second counter divides a reference frequency to provide a second square wave signal to a second input of the phase detector. The phase detector output is negatively fed back to the input of the first voltage controlled oscillator through a feedback impedance. The phase detector output is a signal whose pulse width is a function of the unknown input voltage. The phase detector output is used to gate a counter which counts a reference frequency to provide a digital number that is a function of the unknown voltage.

24 Claims, 3 Drawing Figures

PHASE-LOCKED VOLTAGE-TO-DIGITAL CONVERTER

BACKGROUND OF THE INVENTION

This is a continuation-in-part of application Ser. No. 264,733, filed June 21, 1972.

The present invention relates to an analog voltage-to-digital converter and, in particular, to a conversion circuit that utilizes a voltage-to-frequency conversion circuit in a phase-locked loop.

One type of analog voltage-to-digital converter uses what is known in the art as the successive approximation technique. In the successive approximation technique, the voltage to be converted is applied to one input of a voltage comparator circuit while the other input of the voltage comparator is driven by the output of a programmed digital number-to-analog voltage converter. When the digital number-to-analog voltage converter has been programmed so that its output voltage is equal to the voltage to be converted, the number controlling the digital-to-analog converter is the digital representation of the unknown input voltage. The successive approximation technique requires a precision resistor network in the digital number-to-analog voltage converter which can consist of a dozen or more precision resistors.

With the advent of large scale integration (LSI) techniques, it is desirable to perform as many functions as possible with digital circuits or other circuits that have elements that can be easily fabricated utilizing LSI techniques. In a LSI voltage-to-digital converter, it is desirable to minimize the number of precision elements, such as resistors, in the circuit as it is generally very difficult to fabricate these precision elements within the integrated circuit itself. These precision elements are usually connected externally to the LSI circuit in the form of discrete components, and since the size of each discrete precision component is comparable to the size of the LSI circuit and since each precision component is costly to make, it is apparent that a significant size and cost advantage can be realized by reducing the number of precision components utilized in the analog-to-digital converter circuit.

The use of a voltage-to-frequency converter (voltage controlled oscillator) in the conversion circuit makes it possible to greatly reduce or eliminate the number of precision components in the analog voltage-to-digital converter circuit.

The typical prior art analog voltage-to-digital converter that employed a voltage controlled oscillator required that the voltage controlled oscillator be linear over the full range of input voltages. For example, in one prior art converter, a reference voltage is applied to the input of a voltage controlled oscillator and the output frequency is counted for a fixed period of time; then an unknown voltage is applied to the voltage controlled oscillator and the output frequency is counted for the same fixed period of time. The difference between the two counts provides a digital representation of the difference between the unknown input voltage and the reference voltage.

In another prior art analog voltage-to-digital converter, as disclosed in U.S. Pat. No. 3,351,932, the unknown voltage is applied to the input of an integrating amplifier which drives a voltage controlled oscillator. The output of the voltage controlled oscillator is divided down by a counter, and the counter output triggers a pulse generator which puts out a pulse having a constant voltage amplitude and a constant pulse width which is negatively fed back to the integrating amplifier input. The output frequency of the voltage controlled oscillator is counted for a fixed period of time to obtain a digital number that is representative of the input voltage. The voltage controlled oscillator of this converter also must have a linear characteristic over the voltage range at its input.

Another type of analog voltage-to-digital converter uses a voltage controlled oscillator in a phase-locked loop. In this type of converter negative feedback and filtering is employed so that the voltage controlled oscillator operates at the same steady state input voltage thereby reducing the linearity requirements of the voltage controlled oscillator. The phase-locked loop includes a phase detector that provides a pulse having a time duration that is a function of the voltage being converted. My invention concerns this latter type of converter in which an output counter counts the number of cycles of a reference frequency that occur during the time duration of the phase detector output pulse thereby generating a digital number that is a function of the input voltage being converted.

In order to provide a voltage conversion circuit that can be fabricated with LSI techniques, it is highly desirable to use digital circuit techniques wherever possible. In a voltage conversion circuit that uses a phase-locked loop it may be necessary to compensate for the drift of the frequency versus voltage characteristic of the voltage controlled oscillator. One analog approach for accomplishing drift compensation is to provide an adjustable bias voltage at the input of the voltage controlled oscillator. Another analog approach for accomplishing drift compensation takes advantage of the fact that it is easier to compensate for the drift of a voltage amplifier than of a voltage controlled oscillator, and so an analog integrating amplifier is used to drive the voltage controlled oscillator. Although this compensates for drift of the voltage controlled oscillator, the analog amplifier is still subject to drift which can affect the voltage conversion circuit. It would be desirable to completely eliminate analog drift compensation circuitry and replace it with automatic digital drift compensation circuitry. In the voltage conversion circuit of this invention, the output counter is independent of the elements that make up the phase-locked loop so that drift compensation can be accomplished utilizing digital techniques such as by presetting the output counter with a number representative of the operating voltage of the voltage controlled oscillator prior to a conversion. This eliminates the use of analog compensation circuitry.

Another advantage of using the output counter to count a reference frequency is that the desired resolution of the digital number is made independent of the frequency of operation of the voltage controlled oscillator. Thus, twice the resolution can be obtained by doubling the reference frequency and the capacity of the output counter while the voltage controlled oscillator is operated at the same frequency.

It is, therefore, a principal object of this invention to provide an improved analog voltage-to-digital converter that utilizes a voltage controlled oscillator in a phase-locked loop and which includes an output counter for counting the number of cycles of a reference oscillator that occur during a pulse width analog signal generated in the phase-locked loop.

It is another object of this invention to provide a voltage converter circuit that utilizes a voltage controlled oscillator in a phase-locked loop in which the resolution of the digital number is independent of the frequency of the voltage controlled oscillator.

It is yet another object of this invention to provide a voltage-to-digital converter utilizing a phase-locked loop in which the digital number is counted in a counter that is gated by a signal generated in the phase-locked loop and in which a digital number that is representative of the operating voltage of the voltage controlled oscillator is preset into the counter prior to a conversion.

Another object of this invention is to provide a voltage converter circuit that is suitable for large scale integration.

SUMMARY OF THE INVENTION

In accordance with the invention, an input voltage to be converted is applied to a voltage controlled oscillator through an input impedance. The output of the voltage controlled oscillator is divided in a first counter to provide a square wave input to one input of a phase detector. A reference frequency is divided in a second counter to provide a second square wave signal to a second input of the phase detector. The phase detector output is negatively fed back to the input of the voltage controlled oscillator through a feedback impedance. The phase detector output is a signal whose pulse width is a function of the unknown input voltage. The phase detector output is used to gate a counter which counts the reference frequency to provide a digital number that is a function of the unknown voltage.

DESCRIPTION OF THE DRAWINGS

While the specification concludes with claims particularly pointing out and distinctly claiming that which is regarded as the present invention, the objects and advantages of this invention can be more readily ascertained from the following description of a preferred embodiment when read in conjunction with the accompanying drawings in which:

DETAILED DESCRIPTION

Figure 1:
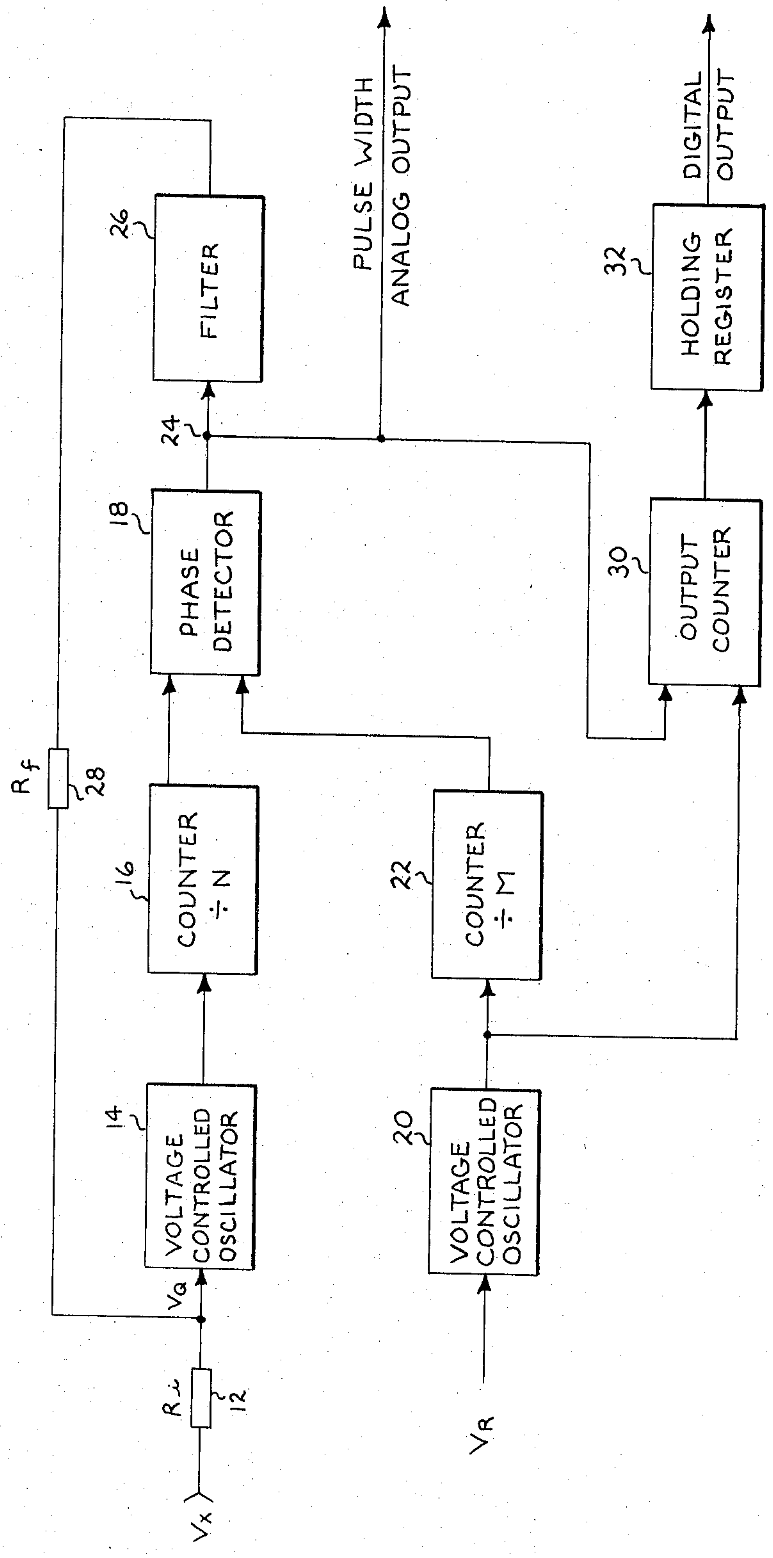
FIG. 1 is a block diagram of a basic voltage conversion circuit utilizing a phase-locked loop.

For the sake of convenience, elements described with reference to a specific figure will retain the same reference designation in the description of subsequent figures. Referring to FIG. 1, the voltage to be converted, $V_X$, is applied to a first voltage controlled oscillator 14 through an input resistor 12 having a value $R_i$. The voltage controlled oscillator is a circuit that has an output frequency that varies as a function of the input voltage. The output frequency of the first voltage controlled oscillator 14 is frequency divided by a first counter 16. The output of the first counter 16 is a square wave signal that drives a first input of a phase detector 18. A reference voltage $V_R$ is applied to the input of a second voltage controlled oscillator 20. The output frequency of the second voltage controlled oscillator 20 is frequency divided in a second counter 22 to provide a reference square wave signal to the second input of phase detector 18.

The phase detector 18 is a circuit having an output signal whose pulse width, or duration, is equal to the difference in phase between the square wave signal output of the second counter 22 and the square wave signal output of the first counter 16. The phase detector 18 could be a flip-flop that is set by the leading edge of the square wave signal from one counter and reset by the leading edge of the square wave signal from the other counter. The phase detector can also be implemented by a logic gate that senses the presence of the square wave signal from the second counter 22 and the absence of the square wave signal from the first counter 16.

The phase detector output 24 is applied to a filter 26 which provides a signal whose average d-c value is proportional to the pulse width of the phase detector output signal 24. The filter output voltage is negatively fed back to the input of the first voltage controlled oscillator 14 through a feed-back resistor 28 having a value $R_f$.

When negative feedback is employed, the above-described circuitry will operate as a phase-locked loop. (For a more detailed discussion of the operation and application of phase-locked loops, refer to the book Phaselock Techniques, Floyd M. Gardner, Wiley, 1966) That is to say, the system will automatically seek a steady state, or quiescent condition, in which the frequency of the square wave signal output from the first counter 16 will equal the frequency of the square wave signal output from the second counter 22. This is explained by the fact that any frequency difference between the two square wave signals will cause a phase difference to be sensed by the phase detector 18 which results in a correction signal being applied to the first voltage controlled oscillator 14 through the feedback resistor 28. When the system is in the steady state, or quiescent condition, a quiescent voltage, $V_Q$, will be present at the input of the first voltage controlled oscillator 14.

As the unknown input voltage changes thereby causing the input of the first voltage controlled oscillator to depart from the quiescent voltage level, the first voltage controlled oscillator 14 responds by changing the frequency of its output signal. The frequency change is sensed as a phase change by phase detector 18 and the filter output is fed back to the input of the first voltage controlled oscillator 14 which acts to return the input of the first voltage controlled oscillator to the quiescent voltage level. When the system again reaches a steady state condition, the input of the first voltage controlled oscillator 14 will be at the quiescent voltage level and the pulse width of the signal out of the phase detector will be a function of the difference between $V_X$ and $V_Q$.

Figure 2:
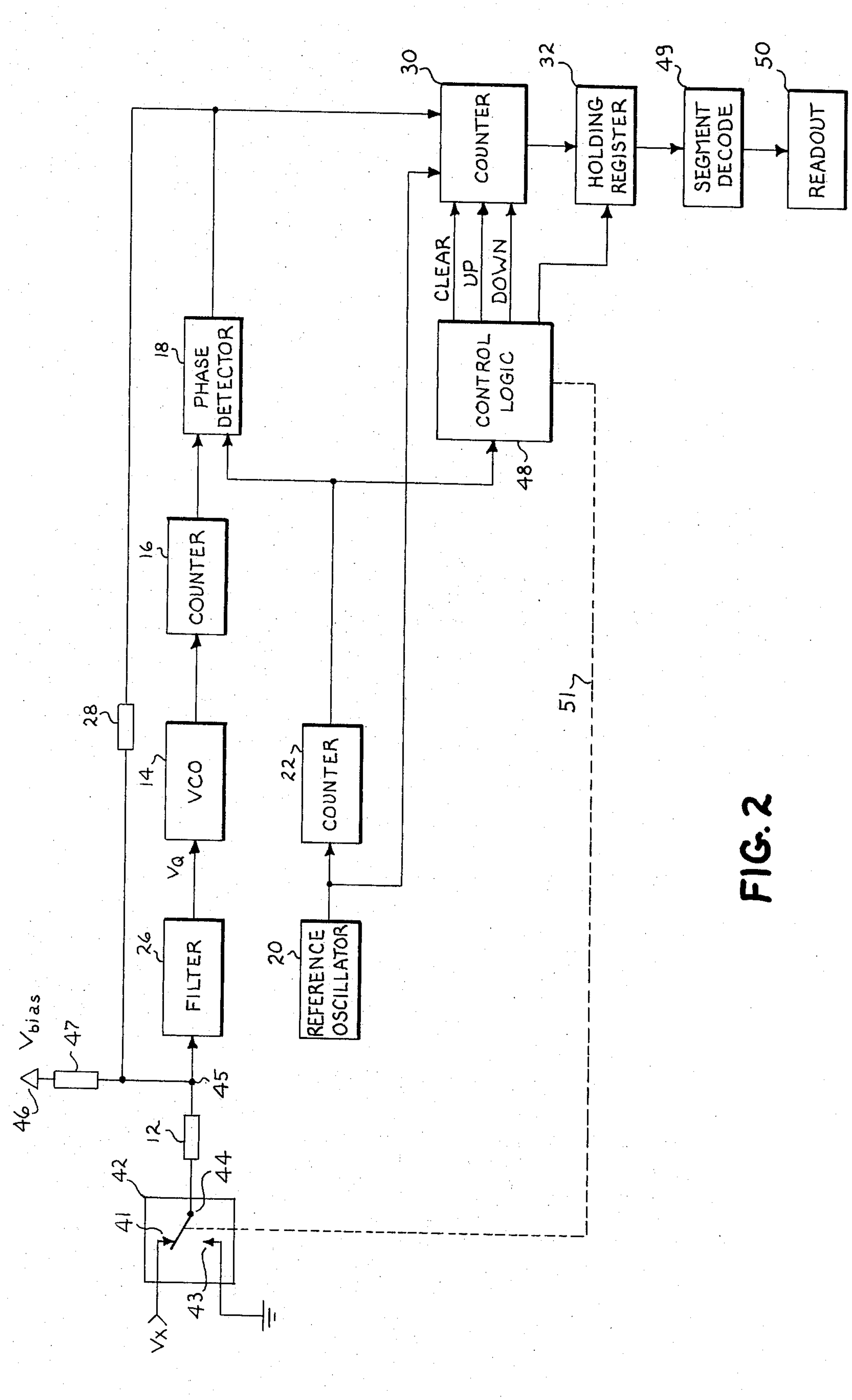
FIG. 2 is a block diagram of a voltmeter that uses the phase-locked loop voltage conversion circuit of FIG. 1.
Figure 3:
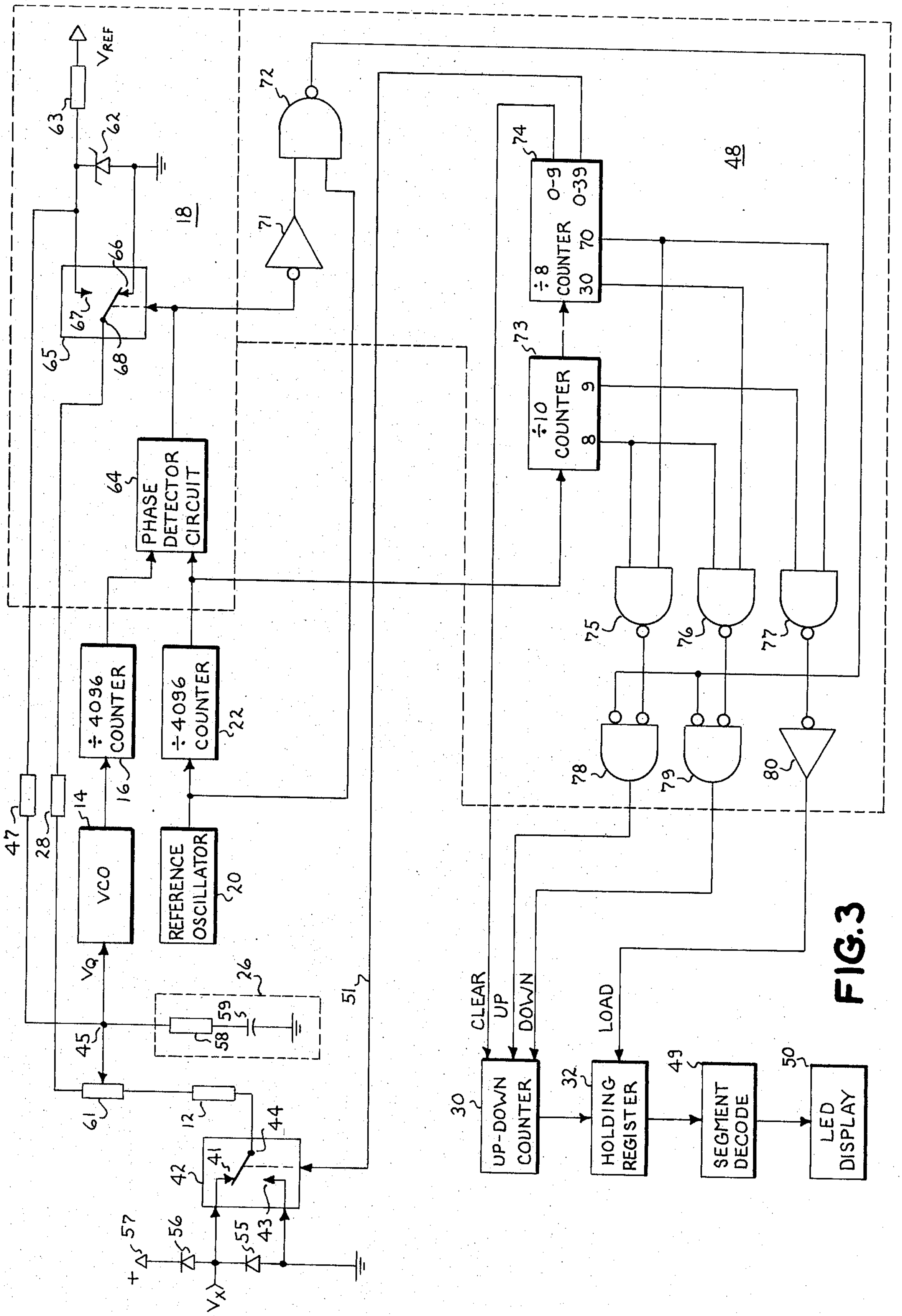
FIG. 3 is a more detailed schematic diagram, partially in block form, of the voltmeter of FIG. 2.

A digital number that is a function of the unknown input voltage is obtained by using the output signal 24 of the phase detector 18 as a gating signal for output counter 30 which counts a reference frequency such as the output of the second voltage controlled oscillator 20. The digital number can be buffered in a holding register 32, where the digital number can be utilized to drive a numerical display to indicate the value of the unknown input voltage as shown in FIGS. 2 and 3.

In certain applications of the voltage conversion circuit of FIG. 1, it may be necessary to compensate for changes in the characteristics of the voltage controlled oscillator 14. A desired operating point of the voltage controlled oscillator 14, that is the quiescent voltage, $V_Q$, and the quiescent frequency of the voltage controlled oscillator that corresponds to that quiescent voltage is generally determined by the value of one or two components, resistors or capacitors, in circuit with the voltage controlled oscillator. Since the voltage controlled oscillator 14 is operating in a phase-locked loop the steady state frequency of the voltage controlled oscillator will always be the quiescent frequency and any change in the characteristic of the voltage controlled oscillator will be manifested by a change in the quiescent voltage, $V_Q$. This change in the quiescent voltage, $V_Q$, causes the pulse width output of the phase detector 18 to have an offset component that is related to the change in the quiescent voltage from the desired value. Depending upon the magnitude of the offset and the desired accuracy of the voltage conversion, it may be necessary to provide offset compensation. This offset compensation can be accomplished in the analog circuitry by adding or subtracting an offset compensation voltage at the input of the voltage controlled oscillator 14. In a preferred embodiment, the offset compensation is accomplished in the digital circuitry by presetting output counter 30 with a number that represents the offset component of the pulse width output of phase detector 18. The offset compensation can be adjusted manually if the voltage controlled oscillator 14 has good long term stability characteristics or can be performed automatically as shown in the embodiment of FIGS. 2 and 3 if it is desired to eliminate the need for manual offset compensation or if the voltage controlled oscillator has relatively poor long term stability characteristics.

As a result of employing negative feedback to the input of the first voltage controlled oscillator 14, when the conversion circuit reaches the steady state condition, the input of the first voltage controlled oscillator 14 is returned to the quiescent voltage, thereby greatly reducing the requirement for linearity of the first voltage controlled oscillator over the full range of unknown input voltages. The use of negative feedback requires only two precision resistors, $R_f$ and $R_i$, instead of the dozen or more required in conversion circuits that employ the successive approximation technique.

Although in theory the two voltage controlled oscillators 14, 20 could be operated at the same frequency, this may not be a practical choice if both oscillators are fabricated from the same semiconductor chip since there may be sufficient interaction between the oscillator circuits to prevent their operating as independent voltage controlled oscillators, and their outputs would instead lock at one of their common harmonic frequencies. Therefore, in such a case, the quiescent frequency of the first voltage controlled oscillator 14 is offset slightly from the reference frequency of the second voltage controlled oscillator corresponding to $V_R$ to minimize this harmonic locking effect. To compensate for this difference in operating frequency of the voltage controlled oscillators 14, 20, the first counter 16 divides the quiescent frequency by N and the second counter 22 divides the reference frequency by M so that during the steady state condition the frequency of both square wave signals into the phase detector 18 are equal.

There is an advantage in having the two voltage controlled oscillators 14, 20 matched in operating characteristics as closely as possible, such as would result if they were fabricated on the same semiconductor chip, because then certain factors, such as temperature changes, would tend to have similar and self-compensating effects on both circuits. Thus, if due to a change in the ambient temperature, the reference frequency of the second voltage controlled oscillator 20 changes, a similar change will occur in the quiescent frequency of the first voltage controlled oscillator 20. Although the change in quiescent frequency of the second voltage controlled oscillator 20 causes the period of the square wave of the output of the second counter 22 to change, the difference in phase will automatically compensate for the change in order to maintain the same feedback voltage to the input of the first voltage controlled oscillator 14.

The embodiment of the voltage conversion circuit as described above included a voltage reference, $V_R$, a second voltage controlled oscillator 20 and a second counter to generate a reference square wave for the phase detector 18. It is clear that in certain applications the voltage controlled oscillator 20 can be replaced by a crystal controlled oscillator. Such an application is shown in FIGS. 2 and 3.

Referring now to FIG. 2, which is a block diagram of a voltmeter that uses the phase-locked loop voltage conversion circuit of FIG. 1, the unknown voltage to be converted, $V_X$, is applied to normally closed contact 41 of single pole, double throw switch 42. A reference potential, such as zero volts, or ground, is applied to normally open contact 43 of switch 42. The pole 44 of switch 42 is connected to the input resistor 12. A reference oscillator 20 drives a counter 22 which provides a fixed frequency reference signal that is applied to one input of a phase detector 18. Similarly, voltage controlled oscillator 14 drives counter 16 to provide a signal to a second input to the phase detector 18. The pulse width analog output of phase detector 18 is fed back to the summing point junction 45 through feedback impedance 28. A bias voltage 46 is applied to the summing point junction 45 through bias resistor 47. Filter 26 filters the signal at the summing point junction 45 and provides the signal applied to the input of voltage controlled oscillator 14. The pulse width analog output of the phase detector 18 is used as a gating signal for the counter 30 which counts the number of pulses from reference oscillator 20 that occur during the pulse width analog output of the phase detector 18. The control logic block 48 responds to the reference signal out of counter 22 and controls the operation of counter 30, holding register 32 and switch 42. A number representative of the unknown input voltage $V_X$ is accumulated in counter 30 and transferred to holding register 32. Holding register 32 drives the segment decode logic 49 which activates readout 50 to provide a numerical display of the unknown voltage $V_X$.

The operation of the basic voltage conversion circuit is as explained in the discussion of FIG. 1.

The inclusion of the bias resistor 47 allows for the selection of that quiescent voltage, $V_Q$, at which the voltage controlled oscillator 14 has the best linearity and sensitivity characteristics.

Although the negative feedback signal that is applied to the summing point junction 45 through feedback resistor 28 acts to keep the average value of the input voltage to the voltage controlled oscillator 14 at the quiescent voltage, $V_Q$, the instantaneous input voltage to the voltage controlled oscillator 14 does change, therefore, any non-linearity of the voltage controlled oscillator 14 can result in an error in the pulse width analog output of the phase detector 18. The function of filter 26 is to limit the ripple voltage that can appear at the input of voltage controlled oscillator 14 thereby limiting the conversion error that is attributed to the non-linearity of the voltage controlled oscillator 14. For a detailed analysis of the various types of filters that can be employed in the phase-locked loop refer to Phaselock Techniques, Gardner, especially to Chapter 2 and Appendix D.

As previously mentioned, the voltage controlled oscillator 14 will normally operate with a quiescent voltage, $V_Q$, at its input with the result that the pulse width analog output of the phase detector 18 and the resultant count in output counter 30 will be some function of the input voltage $V_X$ and the quiescent operating voltage, $V_Q$, of the voltage controlled oscillator 14. The situation is further complicated in that any changes in the characteristics of the voltage controlled oscillator 14, such as might result from temperature change of the voltage controlled oscillator 14, can affect the quiescent voltage $V_Q$. A more subtle effect on the quiescent operating voltage of the voltage controlled oscillator 14 occurs when the frequency of the reference oscillator 20 changes slightly such as in reaction to a temperature change. In order to obtain a number that is proportional to the input voltage, $V_X$, alone, it may be necessary to compensate for the quiescent voltage $V_Q$ and any changes it may undergo. One important aspect of the preferred embodiment of the voltage conversion circuit of FIG. 2 is the use of wholly digital techniques to automatically compensate for the quiescent voltage and variations thereof. The control logic block 48 includes control counters and control logic, shown in detail in FIG. 3, for compensating for the quiescent voltage, $V_Q$. This compensation is accomplished by breaking a voltage conversion into two cycles. During the first cycle, the control logic block 48 operates switch 42 as indicated by dotted line 51 so that a reference potential such as ground, or zero volts, is applied to the input impedance 12. The resulting pulse width analog output of the phase detector 18 is used to gate the counter 30 and the control logic block 48 commands the counter 30 to count downward so that at the end of the first cycle, counter 30 will have a minus count equal to the number of pulses from reference oscillator 20 that occurred during the pulse width analog output of the phase detector 18. This number will be a function of the quiescent voltage, $V_Q$, appearing at the input of voltage controlled oscillator 14. During the second cycle, the control logic block 48 operates switch 42 so that the unknown voltage, $V_X$, is applied to the input impedance 12. The resulting pulse width analog output of the phase detector 18 again gates counter 30 but the control logic block 48 commands the counter 30 to count in the upward direction. The number of pulses counted during the second cycle will be equal to the number of reference oscillator pulses that occurred during the pulse width analog output of phase detector 18. This number will be a function of the quiescent voltage, $V_Q$, plus the unknown voltage, $V_X$, being measured. Since at the beginning of the second cycle the counter 30 contained a minus count equal to the quiescent voltage, $V_Q$, upon the completion of the second cycle, the counter will contain a count proportional to the unknown voltage, $V_X$, to be measured since the quiescent voltage measured during the second cycle will cancel out the value of the quiescent voltage accumulated during the first cycle. The count stored in counter 30 which is proportional to the unknown voltage to be measured is then transferred to holding register 32 and is decoded by segment decode logic 49 which drives readout 50 to provide a visual display of the value of the measured voltage.

FIG. 3 is a more detailed logic diagram partially in block form of the voltage conversion circuit of FIG. 2 for measuring input voltages that range between zero and two volts. Referring now to FIG. 3, the unknown input voltage, $V_X$, is applied to normally closed contact 41 of switch 42. Since, in the preferred embodiment, switch 42 is an electronic switch, the input voltage, $V_X$, is clamped by diodes 55 and 56 so that the normally closed contact 41 of switch 42 cannot go below ground or above some plus voltage 57 in order to protect the electronic switch 42. An adjustment potentiometer has been placed in series with the input impedance 12 and feedback impedance 28 and the arm of potentiometer 61 is connected to the summing point junction 45.

One approach to compensating for the non-linearity and drift characteristics of the voltage controlled oscillator 14 is to make the filter 26 be an active filter. However, this requires the use of a relatively complex amplifier circuit in the filter. In the preferred embodiment of FIG. 3 a simple passive filter 26 consisting of resistor 58 and capacitor 59 is employed to restrict the amount of ripple voltage that can appear at the input of voltage controlled oscillator 14.

The phase detector 18 consists of a phase detector circuit 64 which controls electronic switch 65. The normally closed contact 66 of switch 65 is connected to ground while the normally open contact 67 of switch 65 is connected to the voltage established by zener diode 62 which is driven from a positive voltage $V_{REF}$ applied through a current limiting resistor 63. The pole 68 of switch 65 is connected to a feedback resistor 28 and forms the output of phase detector 18.

In the embodiment of FIG. 3, the reference voltage developed by the zener diode 62 also serves as the bias voltage applied to bias resistor 47.

The control logic block 48 consists of an inverter 71 which provides a logical inversion of the phase detector output signal to one input of AND gate 72. The second input of AND gate 72 is driven by the output of the reference oscillator 20. A divide by 10 counter 73 is driven from the output of the divide by 4096 counter 22. The divide by 10 counter 73 drives a divide by 8 counter 74. Counters 73 and 74 thus count 80 cycles of the output of the divide by 4096 counter 22. The 8 output of the divide by 10 counter 73 drives one input of AND gates 75 and 76. The 9 output of the divide by 10 counter 73 drives one input of AND gate 77. The 70 output of the divide by 8 counter 74 drives the other input of AND gates 75 and 77 and the 30 output of the divide by 8 counter 74 drives the other input of AND gate 76. Thus the output of AND gate 75 will be present for the 79th count of the 80 counts counted by counters 73 and 74. Similarly, AND gate 79 will have an output that is present during the 39th of the 80 counts and the output of AND gate 77 will be present during the 80th count. The o–9 output of counter 74 is connected to the clear input of up-down counter 30. The 0–39 output of divide by 8 counter 74 controls the input switch 42. The output of AND gate 75 enables one input of AND gate 78. The output of AND gate 76 enables one input of AND gate 79, and the output of AND gate 77 is inverted by inverter circuit 80. The other input of AND gates 78 and 79 are driven by the output of AND gate 72. The output of AND gate 78 drives the UP input of the up-down counter 30. The output of AND gate 79 drives the DOWN input of up-down counter 30 and the output of inverter 80 drives the LOAD input of the holding register 32.

Although the operation of the voltage conversion circuit is essentially as explained in the description of FIG. 2, it is to be noted that the voltage being applied to the feedback impedance 28 is either ground or the reference voltage established by zener diode 62 as determined by the operation of the switch 65 by phase detector circuit 64. The average voltage that appears at the pole of switch 65 will be proportional to the time analog output signal of phase detector 64. Even though the average feedback voltage being applied to the feedback impedance 28 is always positive there is negative feedback because the summing point junction 45 is biased to operate at some positive voltage. This can best be illustrated by an example. Assume that the adjustment potentiometer 61 is zero ohms, that the input and feedback impedances 12 and 28 are equal resistors, that the summing point junction 45 is biased to operate at +5 volts, and that the reference voltage established by the zener diode is +10 volts. Since the input resistor and the feedback resistor have the same value, the voltage drop across each resistor will be equal. When the input voltage, $V_X$, is equal to zero volts, there will be 5 volts across the input resistor 12. In order for there to be an average of 5 volts across the feedback resistor 28, the 10 volt zener diode will have to be applied continuously which is equivalent to a 100% duty cycle signal out of the phase detector circuit 64. If the input voltage, $V_X$, is equal to +2 volts, there will be 3 volts across the input resistor 12. In order for there to be an average of 3 volts across the feedback resistor 28, the 10 volt zener diode will have to be applied with a duty cycle of 80%. It can be seen that even though positive voltages are being applied to both the input resistor 12 and the feedback resistor 28 the circuit does operate with negative feedback. It is also noted that the length of time that the zener reference voltage is connected to the feedback resistor is an inverse function of the input voltage, $V_X$, and the length of time that ground is connected to the feedback resistor 28 is a direct function of the input voltage.

The phase detector 64 has an output signal having a pulse width that is related to the input voltage to be measured, $V_X$. It was found that if the phase detector output signal is allowed to vary from 0 to 100% duty cycle, there are certain conditions in which the feedback loop will not operate to lock on to the reference signal being generated by the counter 22. Another problem is that the feedback loop can operate to lock on to the harmonics of the reference frequency established by counter 22. Furthermore, since the phase detector output is discontinuous at 0° and 360° the loop may be unstable for those values of the phase detector output. It has been found that the above-mentioned problems can be eliminated by restricting the range of pulse widths of the phase detector output signal. In the embodiment of FIG. 3, the output signal of phase detector circuit 64 was limited to 25% to 75% duty cycle range. An additional advantage to limiting the duty cycle range of phase detector output signal is that less filtering is required to reduce the effect of non-linearity of the voltage controlled oscillator.

In the preferred embodiment of FIG. 3, the voltage switched to the feedback resistor was chosen to be 6.3 volts because zener diodes in that voltage range are more stable with temperature than other zener diodes.

The ratio of the feedback resistor to the input resistor is determined by the voltage of zener diode 62, the range of the unknown input voltage, $V_X$, and the duty cycle range of the phase detector circuit 64. The embodiment of FIG. 3 in which the unknown input voltage to be measured is to range from zero to +2 volts and wherein the phase detector circuit is constrained to operate within a 25% to 75% duty cycle, the ratio of the feedback resistor to the input resistor is 1.58. In order to provide for full scale adjustment of the voltage measuring circuit a variable resistor 61 is connected in series with input resistor 12 and feedback resistor 28 and the arm of the potentiometer becomes the summing point junction 45.

It was found that a favorable quiescent voltage, $V_Q$, to operate the particular voltage controlled oscillator 14 in the embodiment of FIG. 3 is 5 volts when a 10 volt power supply is used for the voltage controlled oscillator. It is then possible to calculate the value of the bias resistor 47 in terms of a ratio times the input resistor. The assignment of a value to the input resistor will then determine the value of the feedback resistor 28 and the bias resistor 47. For one embodiment of FIG. 3 input resistor 12 is 100,000 ohms, bias resistor 47 is 47,000 ohms, feedback resistor 28 is 158,000 ohms and variable resistor 61 is 20,000 ohms.

The quiescent frequency of the voltage controlled oscillator 14 is about 800 KHz. The reference oscillator 20 has also been selected to be 800 KHz. Since it is desired to have a resolution of one part in 2,000 and since the phase detector circuit 64 is constrained to a 25% to 75% duty cycle range the counters 16 and 22 will have 12 binary stages and one cycle of the signal out of the counters 16 and 22 will occur in about 5 milliseconds.

The filter resistor 58 is 5,600 ohms and the filter capacitor 59 is 0.22 microfarads. These values limit the ripple voltage at the summing point junction to under 1 volt peak-to-peak.

Since the input to the voltage conversion circuit is continually switched between the reference, ground, and the unknown input voltage, $V_X$, it is necessary to let the voltage conversion loop settle in order to be certain that the pulse width output of the phase detector 18 is representative of the voltage being converted. The settling time is determined by the natural frequency and the damping factor of the voltage conversion loop as well as by the desired accuracy of the conversion, (see Phaselock Techniques, Gardner). For input voltages ranging between 0 and 2 volts, approximately 190 milliseconds, as determined by counters 73 and 74, is allowed before the pulse width output of phase detector 18 is measured.

The operation of the control logic 48 for one conversion will now be described. The divide by 10 counter 73 and the divide by 8 counter 74 count 80 cycles of the 5 millisecond square wave signal out of reference counter 22. During the first 40 cycles the 0–39 output of counter 74 operates switch 42 so that ground is connected to the input resistor 12. During the first 10 cycles the 0–9 output of counter 74 clears, or zeroes, up-down counter 30. The voltage conversion loop is allowed to settle for 38 cycles and on the 39th cycle AND gate 76 is enabled. Since AND gate 72 senses the analog pulse width of the phase detector 18 and the pulses from reference oscillator 20, the output of AND gate 72 will be the number of reference pulses from oscillator 20 that occur during the pulse width output of phase detector 18. The output of AND gate 72 and AND gate 76 are combined in AND gate 79 and applied to the DOWN input of up-down counter 30 so that at the end of the 39th cycle counter 30 will have a negative number equal to the number of reference pulses that occurred during the pulse time analog signal during the 39th cycle.

During cycles 41 through 80 the 0–39 output of counter 74 has a different logic level that operates switch 42 so as to cause the unknown input voltage, $V_X$, to be connected to input resistor 12. The voltage conversion loop is allowed to settle for 38 cycles and on the 79th cycle AND gate 75 is enabled. The outputs of AND gate 75 and AND gate 72 are combined in AND gate 78 and applied to the UP input of up-down counter 30 so that at the end of the 79th cycle counter 30 will have a positive number equal to the value of the unknown input voltage, $V_X$. AND gate 77 senses the 80th cycle and causes the number stored in counter 30 to be transferred to holding register 32. The number in holding register 32 drives segment decode logic 49 which in turn drives a display 50, such as a light emitting diode numerical display.

The following commercially available integrated circuit modules were used in one embodiment of the voltage conversion circuit of FIG. 3.

| Element | Integrated Circuit | |
|---|---|---|
| Switch 42 | CD4016AE | COS/MOS |
| Switch 65 | CD4016AE | COS/MOS |
| VCO 14 | CD4046AE | COS/MOS |
| Phase Detector 64 | CD4046AE | COS/MOS |
| Counter 16 | CD4020AE | COS/MOS |
| Counter 22 | CD4020AE | COS/MOS |
| Counter 73 | CD4017AE | COS/MOS |
| Counter 74 | CD4022AE | COS/MOS |
| Gate 72 | CD4011AE | COS/MOS |
| Gate 75 | CD4011AE | COS/MOS |
| Gate 76 | CD4011AE | COS/MOS |
| Gate 77 | CD4011AE | COS/MOS |
| Gate 71 | CD4001AE | COS/MOS |
| Gate 78 | CD4001AE | COS/MOS |
| Gate 79 | CD4001AE | COS/MOS |
| Gate 80 | CD4001AE | COS/MOS |
| Counter 30 | 74192 | TTL |
| Holding Register 32 | 7475 | TTL |
| Segment Decode | 7446 | TTL |

Only three precision components were employed in the voltage converter of FIG. 3; the 6.3 volt zener diode 62, the input resistor 12 and feedback resistor 28. This is a significant reduction over those prior art converters that require the use of a network of precision resistors. Since the other elements of the converter are state-of-the art, commercially available integrated circuits, it is apparent that this voltage conversion circuit can be implemented as a single LSI circuit.

A voltage conversion circuit for converting voltages ranging from 0 to 2 volts has been built utilizing components as disclosed above. The voltage converter had a resolution of ± 1 millivolt and a maximum nonlinearity of ± 1.9 millivolts over the full input voltage range.

While the present invention has been described with reference to a specific embodiment thereof, it will be obvious to those skilled in the art that various changes and modifications may be made without departing from the invention in its broader aspects. For example, the voltage conversion circuit of this invention could be adapted to handle bipolar input voltages. It is contemplated in the appended claims to cover all variations and modifications of the invention which come within the true spirit and scope of the invention.

What is claimed as new and desired to be secured by Letters Patent of the United States is:

1. A voltage conversion circuit comprising:

a. first circuit means having an input responsive to a voltage for generating an output signal having a frequency that is a function of the voltage at its input, said output signal frequency being substantially equal to the frequency of a first reference signal when a quiescent voltage is present at the first circuit means input;

b. second circuit means responsive to the first reference signal and to the first circuit means output signal for generating a signal having a first time duration proportional to the phase difference between the first reference signal and the first circuit means output signal and a second time duration inversely proportional to said phase difference;

c. input impedances means for coupling an unknown input voltage to the first circuit means input;

d. feedback impedance means for negatively feeding back the output signal of the second circuit means to the input of the first circuit means, whereby said phase difference is made a function of the unknown input voltage when the first circuit means input has the quiescent voltage thereat; and e. output counter means responsive to the first time duration of the second circuit means output signal and to the frequency of a second reference signal for counting the number of cycles of said second reference signal that occur during said first time duration whereby the counter generates a digital number that is a function of the unknown input voltage.

2. A voltage conversion circuit as recited in claim 1 additionally comprising third circuit means responsive to a reference voltage for generating the first reference signal.

3. A voltage conversion circuit as recited in claim 1 additionally comprising:

a. signal generating means responsive to a reference voltage for generating a third reference signal; and b. counter means responsive to the frequency of the third reference signal for generating said first reference signal.

4. A voltage conversion circuit as recited in claim 1 wherein the first circuit means comprises:

a. signal generating means having an output responsive to a voltage for generating an output frequency that is a function of its input voltage; and b. counter means responsive to the signal generating means output frequency for generating said output signal.

5. A voltage conversion circuit as recited in claim 1 additionally comprising a filter circuit for filtering the input voltage of the first circuit means.

6. A voltage conversion circuit as recited in claim 1 additionally comprising:

a. a holding register for storing the digital number generated by the output counter; and b. readout means responsive to the holding register for providing a visual display of the number stored in the holding register.

7. A voltage conversion circuit as recited in claim 1 wherein the second circuit means includes switch means for connecting a first reference voltage to the feedback impedance means during the first time duration and a second reference voltage to the feedback impedance means during the second time duration.

8. A voltage conversion circuit as recited in claim 1 additionally comprising circuit means for compensating for any drift of said quiescent voltage including means for storing in the output counter prior to a voltage conversion a number representative of a reference voltage so that the number generated by the output counter indicates the difference between the unknown voltage and the reference voltage.

9. A voltage conversion circuit as recited in claim 1 additionally comprising:

a. counter means responsive to the frequency of the second reference signal for generating the first reference signal.

10. A voltage conversion circuit as recited in claim 9 wherein the first circuit means comprises:

a. signal generating means having an output responsive to a voltage for generating an output frequency that is a function of its input voltage; and b. counter means responsive to the signal generating means output frequency for generating said output signal.

11. A voltage conversion circuit as recited in claim 10 additionally comprising:

a. a holding register for storing the digital number generated by the output counter; an b. readout means responsive to the holding register for providing a visual display of the number stored in the holding register.

12. A voltage conversion circuit as recited in claim 11 wherein the second circuit means includes switch means for connecting a second reference voltage to the feedback impedance means during the first time duration and a third reference voltage to the feedback impedance means during the second time duration.

13. A voltage conversion circuit as recited in claim 12 additionally comprising a filter circuit for filtering the input voltage of the first circuit means.

14. A voltage conversion circuit as recited in claim 13 additionally comprising circuit means for compensating for any drift of said quiescent voltage including means for storing in the output counter prior to a voltage conversion a number representative of a reference voltage so that the number generated by the output counter indicates the difference between the unknown voltage and the reference voltage.

15. A voltage conversion circuit as recited in claim 14 additionally comprising an oscillator for generating the second reference signal.

16. A circuit for use in a voltage converter for generating a digital number that is a function of an unknown voltage including an input impedance and a feedback impedance comprising:

a. first circuit means having an input responsive to a voltage for generating an output signal having a frequency that is a function of the voltage at its input, said output signal frequency being substantially equal to the frequency of a first reference signal when a quiescent voltage is present at the first circuit means input;

b. second circuit means responsive to the first reference signal and to the first circuit means outward signal for generating a signal having a first time duration proportional to the phase difference between the first reference signal and the first circuit means output signal and a second time duration inversely proportional to said phase difference said first circuit means being adapted to be connected to the input impedance so that the unknown voltage is coupled to the first circuit means input and wherein the first circuit means input and the second circuit means output are adapted to be connected across the feedback impedance, whereby said phase difference is made a function of the unknown input voltage when the first circuit means input has the quiescent voltage thereat; and c. output counter means responsive to the first time duration of the second circuit means output signal and to the frequency of a second reference signal for counting the number of cycles of said second reference signal that occur during said first time duration whereby the counter generates a digital number that is a function of the unknown input voltage.

17. A circuit as recited in claim 16 additionally comprising:

a. counter means responsive to the frequency of the second reference signal for generating the first reference signal.

18. A circuit as recited in claim 17 wherein the first circuit means comprises:

a. signal generating means having an output responsive to a voltage for generating an output frequency that is a function of its input voltage; and b. counter means responsive to the signal generating means output frequency for generating said output signal.

19. A circuit as recited in claim 18 additionally comprising:

a. a holding register for storing the digital number generated by the output counter.

20. A circuit as recited in claim 19 additionally comprising:

a. readout means responsive to the holding register for providing a visual display of the number stored in the holding register.

21. A circuit as recited in claim 19 wherein the second circuit means includes switch means for connecting a second reference voltage to the feedback impedance means during the first time duration and a third reference voltage to the feedback impedance means during the second time duration.

22. A circuit as recited in claim 19 additionally comprising a filter circuit for filtering the input voltage of the first circuit means.

23. A circuit as recited in claim 19 additionally comprising circuit means for compensating for any drift of said quiescent voltage including means for storing in the output counter prior to a voltage conversion a number representative of a reference voltage so that the number generated by the output counter indicates the difference between the unknown voltage and the reference voltage.

24. A circuit as recited in claim 19 additionally comprising an oscillator for generating the second reference signal.

* * * * *